United States Patent [19]

Johnston

[11] 4,298,839
[45] Nov. 3, 1981

[54] PROGRAMMABLE AC ELECTRIC ENERGY METER HAVING RADIATION RESPONSIVE EXTERNAL DATA INTERFACE

[75] Inventor: Paul M. Johnston, Raleigh, N.C.

[73] Assignee: Westinghouse Electric Corp., Pittsburgh, Pa.

[21] Appl. No.: 891,997

[22] Filed: Mar. 31, 1978

[51] Int. Cl.³ .................. G01R 11/04; H04B 9/00; G08C 9/06
[52] U.S. Cl. .................. 324/157; 179/2 AM; 250/551; 324/96; 324/116; 324/156; 340/870.02; 340/870.28; 455/602
[58] Field of Search ............ 324/96, 103, 113, 116, 324/137, 142, 153, 156, 157; 340/150, 151, 188 R, 189 R, 190, 204, 152 R, 310 A; 250/199, 233, 239, 551; 364/483, 511; 346/14 MR; 179/2 AM, 2 DP; 455/602, 610, 612, 613, 617, 607

[56] References Cited

U.S. PATENT DOCUMENTS

| | | | |
|---|---|---|---|
| 3,258,692 | 6/1966 | Jacomini et al. | 324/113 |
| 3,380,064 | 4/1968 | Norris et al. | 324/113 X |
| 3,503,061 | 3/1970 | Bray et al. | 179/2 AM X |
| 3,789,193 | 1/1974 | Bremner . | |
| 4,050,020 | 9/1977 | Germer et al. | 324/116 |
| 4,056,711 | 11/1977 | Lamar . | |
| 4,063,083 | 12/1977 | Cathey et al. | 455/607 |
| 4,072,399 | 2/1978 | Love | 455/612 X |
| 4,077,061 | 2/1978 | Johnston et al. . | |
| 4,081,746 | 3/1978 | Snyder et al. | 324/116 |
| 4,082,999 | 4/1978 | Staker | 324/116 |
| 4,083,083 | 12/1978 | Cathey et al. . | |
| 4,104,533 | 8/1978 | Iverson | 455/602 |
| 4,110,814 | 8/1978 | Britton et al. | 324/156 |
| 4,119,948 | 10/1978 | Ward et al. | 250/199 X |
| 4,130,738 | 12/1978 | Sandstedt | 179/2 DP |

FOREIGN PATENT DOCUMENTS

| | | |
|---|---|---|
| 1291992 | 10/1972 | United Kingdom . |
| 1330076 | 9/1973 | United Kingdom . |
| 1378648 | 12/1974 | United Kingdom . |
| 1524794 | 9/1978 | United Kingdom . |
| 1524795 | 9/1978 | United Kingdom . |

*Primary Examiner*—Gerard R. Strecker
*Attorney, Agent, or Firm*—E. L. Pencoske

[57] ABSTRACT

An electric energy meter has a programmable time based measuring system carried in a sealed enclosure for mounting the meter at a metering location. A radiation sensitive external data interface receives and transmits data encoded radiations through a transparent communications window of the enclosure. Pulse data is processed by the external data interface in serial data bit transmissions in and out of the measuring system for programming, readout and testing of the system.

11 Claims, 10 Drawing Figures

PROGRAMMABLE AC ELECTRIC ENERGY METER HAVING RADIATION RESPONSIVE EXTERNAL DATA INTERFACE

BACKGROUND OF THE INVENTION

1. Field of the Invention

This invention relates to an external data communication arrangement for a programmable AC electric energy meter having a sealed enclosure and more particularly to such an arrangement including a transparent communications window portion of the enclosure for receiving and transmitting coded radiations into and from a radiation sensitive external data interface.

2. Description of the Prior Art

Induction watthour meters including electromechanical meter movements are almost universally used for use as electric energy billing meters. The use of such induction watthour meters are well established because of their high degree of accuracy, mass production by economical manufacturing techniques, high reliability during many years of service under widely varying ambient operating conditions, and simple and easy installation. Presently, solid state electronic circuits are increasingly being used since the size and cost of complex electronic circuits have been substantially reduced by the use of large-scale integration circuit techniques and such circuits have been found to have increasing reliability and extended ambient operating ranges of operation. Accordingly, it is sometimes possible to utilize electronic circuits to replace all or portions of the prior electromechanical meter movement of induction watthour meters. The use of such circuits provides the advantages of larger varieties of different modes of measuring operations, including measurements of different parameters of electric energy consumption and the ability to separately perform such measurements at different time of usage periods corresponding to the on and off peak load conditions of an electric utility distribution system supplying the electric energy being measured.

In U.S. Pat. No. 4,077,061, issued Feb. 28, 1978, for A Digitally Processing And Calculating AC Electric Energy Measuring System, and assigned to the assignee of this invention, an all solid state electronic metering circuit is described and claimed utilizing a microprocessor forming a digital sequence controller and calculator subsystem. A program read-only memory (ROM) and a data random access memory (RAM) are disclosed for use with the microprocessor based system. The metering system is an integral package intended to receive certain analog voltage and current signals to be measured and to also receive integral timing pulses so as to produce a number of different measuring output signals and to also provide a visual readout display representing such signals. Manual switch inputs are also provided for the selection of one of the different parameters being made for visual display. The aforementioned system does not disclose a method of transmitting and receiving program data information. As is known in the use of such programmable processors, the ability to change or add program data information is sometimes found desirable. The program data must be supplied through an external data interface not disclosed in the aforementioned patent.

Since billing meters incorporating solid state electronic circuits are required to perform in the same ambient environments as are the prior all-electromechanical types of induction meters and to be attachable at existing meter sockets, the same general type of meter enclosures are required. These enclosures typically include a base and a transparent cup-shaped cover attached to the base. The cover is usually made of a transparent glass or impact resistant transparent plastic material to protect the metering system from environmental conditions and to protect the system from unauthorized access thereto. When an electronic programmable electric energy measuring system is housed in such an enclosure, it is desirable to maintain the protective and securing features of the enclosure while providing external connections thereto when required. In U.S. Pat. No. 4,110,814, issued Aug. 29, 1978, and assigned to the assignee of this invention, a watthour meter enclosure is disclosed wherein an opening is provided in the side of the enclosure to form a passage for wire conductors connected to an electronic meter encoding circuit for remote meter reading systems.

In U.S. Pat. No. 4,050,020, A Multiple Rate Electrical Energy Metering System is disclosed having a programmable digital logic control circuit. The system further includes a circulating memory incorporating a programmable timing circuit arrangement. A socket type connector is disclosed for receiving a plug associated with a portable programmer and tester unit used to transmit data to the memory portion of the system. The programmer plug is insertable through the face of the cup-shaped meter cover and a removable lock or seal is required to prevent unauthorized access to the socket connector.

While the aforementioned physical connections through the meter enclosure are often quite satisfactory, it is sometimes desirable to further protect the metering circuits by avoiding the necessity of providing openings through the enclosure.

An optical reader for externally programming a microprocessor is disclosed in U.S. Pat. No. 4,056,711, wherein optically coded patterns of reflecting and nonreflecting indicia are positioned over optical transducers of the reader. Coded impulses from the transducers produce address and data to random access memories of the programming system. In U.S. Pat. No. 3,789,193, machine readable indications are sensed by an optical reader which transmits corresponding data pulses to a computer controller. In U.S. Pat. No. 4,063,083, an optical data link is established between interfacing assemblies by selectively positioning apertures of matrix boards in a fixed optical light path. Optical data communication is thereby provided between spaced locations.

Accordingly, it is desired to transmit and receive data to and from an electric energy meter having a programmable measuring system including an associated read-write programmable memory housed in a weatherproof and tamper resistant enclosure without alteration or interference with the integrity of such an enclosures. It is further desirable to establish radiation responsive type data link with such measuring systems through a transparent communications window portion of a meter enclosure. The radiation data link is desired to be provided by a compact, reliable, and easily assembled arrangement that is simply used and protects against both outdoor environmental conditions and tampering of electric energy measuring systems.

SUMMARY OF THE INVENTION

In accordance with the present invention an AC electric energy meter includes a programmable time based measuring system having a programmed sequence of operation controlled by a metering sequence logic control circuit for effecting different measured values of parameters used to indicate different usage categories of an electric energy quantity to be measured. The measuring system is mounted within a watthour meter enclosure including a preselected radiation transparent portion or communications window formed in a meter cover part of the enclosure. The logic control circuit includes an input/output (I/O) unit that is connected to a radiation sensitive external data interface made in accordance with this invention and mounted within the enclosure. A programmable data random access memory (RAM) is connected to the I/O unit to receive and transmit binary data information required by the logic control circuit to measure the desired electric energy parameters. A bidirectional radiation data link is provided through the transparent communications window of the enclosure to transfer external data in and out of the I/O unit.

Electronic radiation detector means is provided in the external data interface as well as optoelectronic radiation emitter means to translate encoded radiations and electronic coded pulses connected to the I/O unit. The electronic detector means and emitter means are positioned in optical radiation responsive communication with the transparent communications window portion of the meter enclosure so as to receive and transmit the binary coded radiations to transfer corresponding binary information into and out of the data RAM memory. In a preferred form of the invention, the external data input of the interface includes two optoelectronic radiation detectors connected to external data in and external strobe in terminals of the I/O unit. Accordingly, the external data output of this interface includes two optoelectronic emitters connected to external data out and external strobe out terminals of the I/O unit. The optoelectronic emitters and detectors are mounted in spaced relationship from each other and the transparent communications window portion of the meter cover. A radiation shielding baffle is provided between the radiation emitters and detectors and the transparent communications window of the cover. The shielding baffle includes separate tunnel apertures each aligned with a separate one of the emitters and detectors to isolate the separate radiations for transmitting non-interfering radiations from and to the detectors and emitters. The communications window portion of the meter cover includes a recessed indexing arrangement for receiving a portable programmer-reader unit in communications registration with the radiation emitters and detectors.

External data transfer is performed in a synchronous transmission mode utilizing the four electronic radiation detector and emitter devices. The strobe in and strobe out data are used to signal when the transmitting one of the field programmer-reader or the logic control circuit is ready for transmission and the receiving one of the two to effect acknowledge signals when it is in a state to acknowledge and be conditioned for receiving the coded radiation data. Data in and data out data lines are then synchronized to the strobe in and strobe out data lines of the I/O unit so that data transfer can be accomplished at the desired rate of either the transmitter or receiver of the data.

The external data interface is further capable of providing external control of portions of the meter time based measuring system. In one preferred embodiment, simultaneous radiation stimulation of the two radiation detectors switches an electronic readout display from an inactive to an active display status.

It is a general feature of the present invention to provide a unique communication data link for an electric energy meter having a programmable measuring system housed in a protective enclosure so that no physical connections are required through the enclosure. It is a further feature of this invention to provide an optical radiation link for data programming and testing through the transparent cover of a watthour meter enclosure for communicating in a serial synchronous mode of data transfer to the data RAM memory of a metering sequence logic control circuit providing accumulation of real time measured values of time of usage parameters of an electric energy quantity. A further feature of the invention is to provide for external programming of initial real time data and of preselected time of use time categories data through a radiation data link of an electric energy meter measuring time of use parameters of an AC electric energy quantity. A still further feature of this invention is to provide an optical radiation data link between a programmable time based measuring system of an electric energy billing meter and a portable programmer-reader which is simply and reliably used for programming, testing and reading out of electronically stored measured data and which affords flexibility in varying the speeds of data transfer and assurance that such data transfer is made in an accurate manner and which further prevents unauthorized tampering of the meter.

These and other features and advantages of the present invention will become apparent from the detailed description of the drawings briefly described hereinafter.

DESCRIPTION OF THE PREFERRED EMBODIMENT

Figure 1:
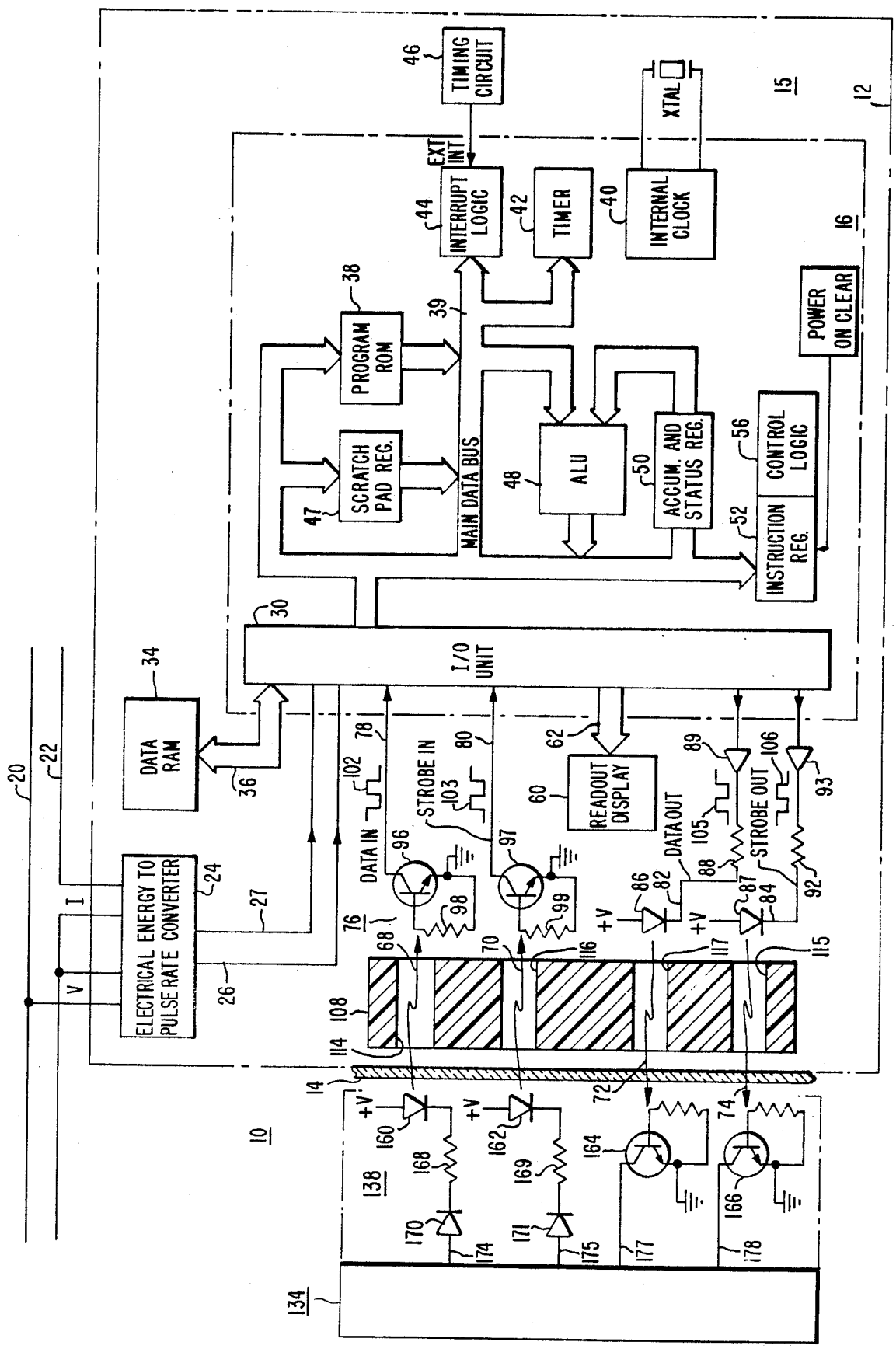
FIG. 1 illustrates a block schematic diagram of an electric energy meter including a radiation sensitive external data interface made in accordance with the present invention.

Referring now to the drawings, and more particularly to FIG. 1, there is shown a block schematic diagram of a programmable AC electric energy meter 10 carried in an enclosure 12 of a type used for housing induction watthour meters and including a predetermined radiation transparent communications window portion 14 described more fully hereinbelow. The meter 10 includes a programmable time based measuring system 15 including a metering sequence logic control circuit 16. In one preferred embodiment the logic control circuit is formed by a single-chip micro-computer type MK 3870 available from the Mostek Corporation, Carrollton, Texas 75006. The logic control circuit 16 is operative to calculate and accumulate different measured parameters of an electric energy quantity to be measured and flowing in the conductors 20 and 22. A voltage component V and a current component I are applied to an electrical energy to pulse rate converter 24. Pulses are produced at the output of the converter 24 on the conductors 26 and 27 which have a pulse rate proportional to the rate of electrical energy consumption supplied by the conductors 20 and 22. In one preferred form of the invention, the converter 24 is formed by a conventional induction watthour meter having an electromagnetic metering movement driving an electroconductive disc at a rate responsive to the rate of consumption of electric energy. A pulse initiator is responsive to the disc rotations to produce the pulse output on the conductors 26 and 27. The following U.S. Pat. Nos. 3,733,493 issued May 15, 1973; 3,878,391 issued Apr. 15, 1975; 3,943,498 issued Mar. 9, 1976; and 4,034,292 issued July 5, 1977, all assigned to the assignee of this invention, disclose pulse initiator systems for producing the desired pulses on the conductors 26 and 27. It is also contemplated that other electric energy to pulse rate converters may be used, for example the electronic watthour metering circuits described in the following U.S. Pat. Nos. 4,056,774 issued Nov. 1, 1977 and 3,764,908 issued Oct. 9, 1973, both assigned to the assignee of this invention produce pulses responsive to the rate of electric energy flow in a circuit to be measured.

The programmable time based measuring system 15 is further described in U.S. Pat. No. 4,197,582 filed Mar. 31, 1978, assigned to the assignee of this invention, and is incorporated herein by reference. A block diagram of the logic control circuit 16 is shown in FIG. 1 and is described more fully in the Mostek publication F8 Microprocessor Devices, Single-Chip Microcomputer MK 3870 dated July, 1977. An input/output (I/O) unit 30 is formed by the I/O port described in the aforementioned Mostek publication. The I/O unit 30 receives the conductors 26 and 27 to apply the pulses to the control circuit 16. A data read-write or random access memory (RAM) 34 is connected by bus 36 including plural data lines connected to the I/O unit 30. The data RAM memory 34 includes electronic memory for storage of mathematical constants required in calculating and accumulating values of the electric energy parameters to be measured from the pulses from the converter 24. The data RAM 34 also stores real time of day information and other programmed reference time data to effect measurements of time of usage parameters of the electric energy quantity to be measured at predetermined time categories or periods which correspond to on peak, off peak, and shoulder peak or high, mid and low rate billing periods.

The control circuit 16 has the general configuration as shown in FIG. 1 and described in the aforementioned publication. The operation is further described in aforementioned U.S. Pat. No. 4,197,582. Generally, a permanently fixed programmed sequence of instructions for controlling the steps of operation of the circuit 16 is stored in a program read-only memory (ROM) 38. A main data bus 39 interconnects the different units of the circuit 16. An internal clock unit 40 is connected to an external oscillator crystal XTAL to provide timing signals for internal operation of the circuit 16. A timer unit 42 and interrupt logic 44 operate in the event counter mode with sixty hertz pulses being applied from a timing circuit 46 to the external interrupt (EXT INT) terminal of the circuit 16. Once each second the circuit updates appropriate ones of plural time storing registers in the RAM memory 34. The time of day in hours, minutes and seconds is maintained as well as the day of the week and further the day of the year is stored if desired. Electric energy related pulses from the connectors 26 and 27 are processed by operation of the scratch pad register 47, arithmetic-logic ALU unit 48, accumulator and status register unit 50, the instruction register unit 52 and control logic 56 in the program sequence of the ROM unit 38 as described in the aforementioned MOSTEK publication. The circuit 16 totalizes and stores in the data RAM memory 34 the values of the electric energy parameters to be measured including kilowatt hours and kilowatt demand for the predetermined high rate, mid rate and low rate periods during each day. Visual readout of the values measured, totalized, and stored in the RAM memory 34 is made at a visual display 60 formed by eight digit display elements of a seven-segment LED type electronic display connected by a data bus 62 to the I/O unit 30. The eight digit display elements are included in two electron display packages type 5082-7414. The stored read-write memory data is also read out in pulse signal by means of the present invention described below.

To effect proper operation of the meter 10, certain binary data information must be stored in the RAM memory 34. The program data memory information must be initially stored, be capable of being changed, be checked to verify the operation of the meter 10. Also, stored data values of the measured electric energy parameters must be capable of being read electronically from the meter. For example, the different time of day measuring periods may be changed for changing the times at which different rates of billing are to be made for both kilowatt hour and kilowatt demand parameters of the electric energy time of usage measurements. Also, mathematical constants, used by the metering sequence logic control circuit 16 to calculate the kilowatt hours and kilowatt demand parameters, are desired to be checked periodically. Still further, it may be desired to check the time of day which is being calculated by the control circuit 16 from signals applied from the timing circuit 44 and thereafter stored in the RAM unit 34.

Figure 3:
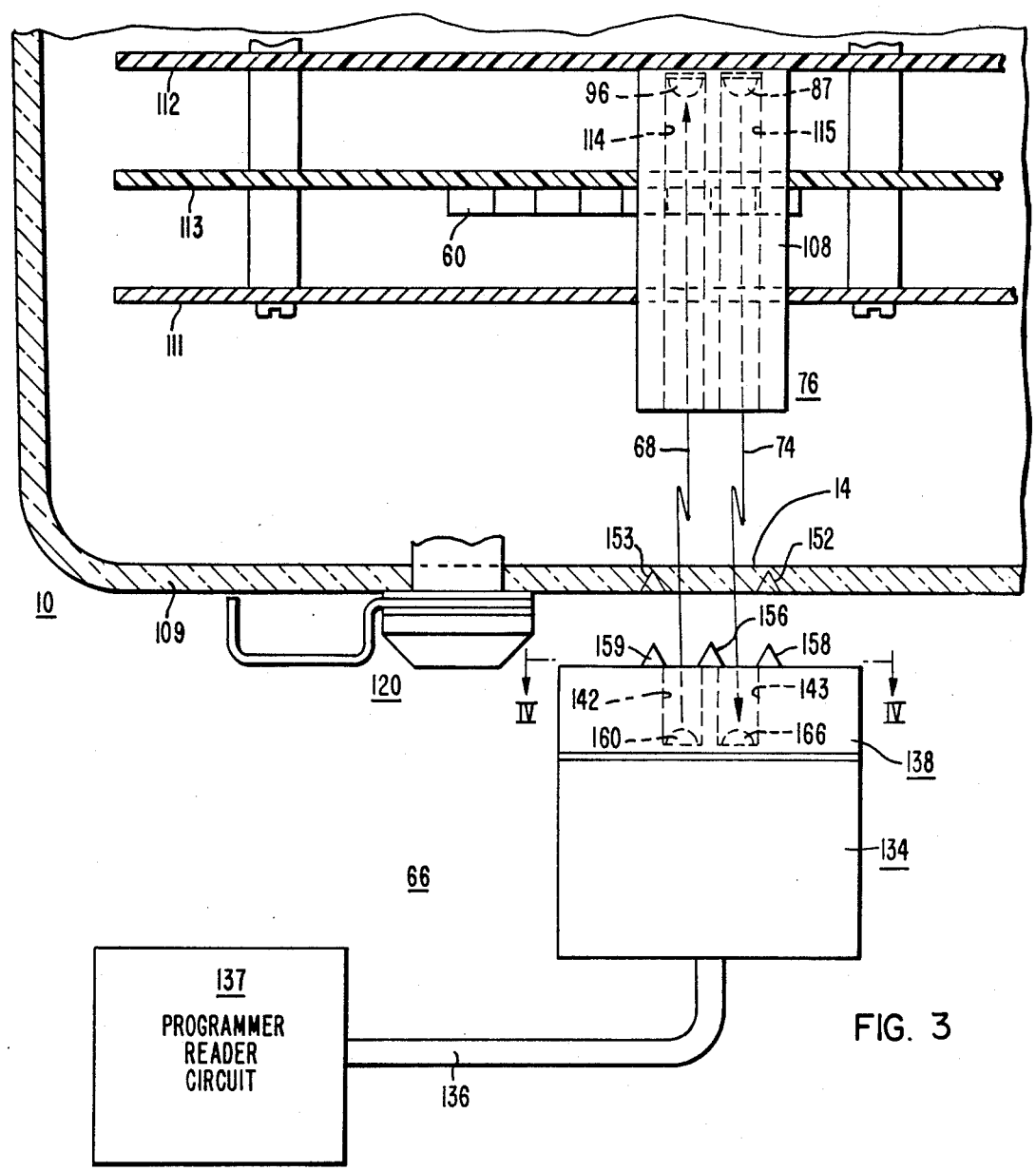
FIG. 3 is a fragmentary top elevational view, partially in section, of a portion of the meter shown in FIG. 2 including the external data interface and a field programmer-reader assembly associated therewith.

A portable field programmer-reader 66, shown in FIG. 3, is used to initially and periodically thereafter, store, read and check binary data information in the RAM memory 34. Binary coded radiations 68, 70, 72 and 74, described further hereinbelow, pass through the preselected radiation transparent communications window 14 of the enclosure 12 to couple radiations with a radiation sensitive external data interface 76. The term communications window as used herein refers to any part of the enclosure 12 through which the information of the radiations 68, 70, 72 and 74 is transmitted and received to effect programming testing or readout of data. Four conductors or data lines 78, 80, 82, and 84 connect the interface 76 with four pin terminals of the input/output unit 30 for conducting electronic pulse signals therebetween. The line 78 is designated as a DATA IN line, the conductor 80 is designated a STROBE IN line, the conductor 82 is connected in series with a DATA OUT line and the conductor 84 is connected in series with a STROBE OUT line.

In the radiation sending portion of the interface 76, first and second radiation emitters 86 and 87 are connected to the lines 82 and 84, respectively, and a source of voltage +V. The conductor 82 is connected in series with resistor 88 and a transistor amplifier 89 connected to one terminal of the I/O unit 30. The conductor 84 is connected in series with a resistor 92 corresponding to the resistor 88 and a transistor amplifier 93 corresponding to the amplifier 89 and is further connected to another terminal of the I/O unit 30. The first and second radiation emitters 86 and 87 are preferably optoelectronic type radiation emitters formed by light-emitting diode (LED) devices of a type GE55B. These devices emit light radiations having principal frequencies in the infrared spectrum.

The radiation receiving portion of the interface 76 includes first and second radiation sensors 96 and 97 connected in series with the conductors 78 and 80, respectively. The first and second radiation sensors 96 and 97 are each formed by an optoelectronic semiconductor type of a phototransistor type LS 8047 having resistors 98 and 99 connected across the base to emitter circuit thereof and to ground as shown. The radiation sensors 96 and 97 are responsive to electromagnetic radiations 68 and 70 when they are light radiations in the infrared frequency region corresponding to the light electromagnetic radiations of the emitters 86 and 87. Accordingly, the optoelectronic semi-conductors forming the light-emitting diode radiation emitters 86 and 87 produce electromagnetic radiations 72 and 74 which are light radiations chiefly in the infrared frequency bandwidth.

The radiations 68 and 70 activate the radiation sensors 96 and 97 to produce the DATA IN pulse 102 in the conductor 78 and the STROBE IN pulse 103 in the conductor 80. Accordingly, the pulses 102 and 103 are applied to terminals of the I/O unit 30. The two terminals of the I/O unit 30 connected with the conductors 82 and 84 produce DATA OUT pulses 105 and the STROBE OUT pulses 106 to activate the radiation emitters 86 and 87, respectively, to produce the corresponding electromagnetic light radiations 72 and 74.

Figure 2:
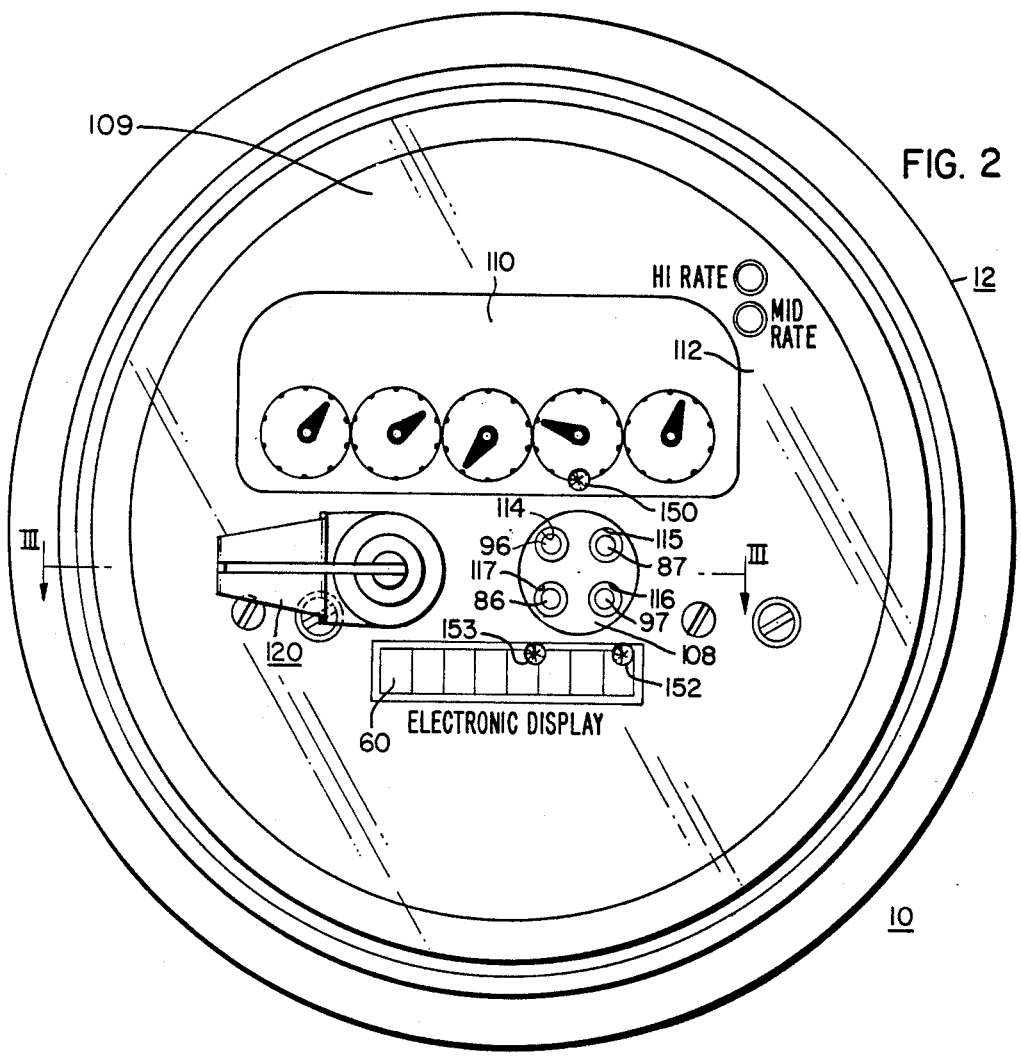
FIG. 2 is a front elevational view of the electric energy meter shown in FIG. 1.
Figure 4:
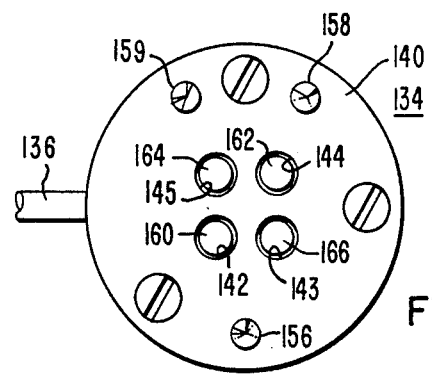
FIG. 4 is a cross-sectional view taken along the axis IV—IV of FIG. 3 looking in the direction of arrows of a probe of the programmer-reader assembly shown in FIG. 3.

A radiation shielding baffle 108 forms a radiation coupling and isolation member extending from the radiation sending and receiving portions of the interface 76 toward the inside of the communications window portion 14 of the enclosure 12 to isolate and couple the separate radiations of the radiation emitters 84 and 86 and the radiation sensors 96 and 97 as described more fully in connection with the description of FIGS. 2, 3 and 4. The radiation shielding baffle 108 assures that there is no interference between the separate radiations 68, 70, 72 and 74.

In FIG. 2 there is shown a front view of the meter 10 having an enclosure 12 including a cup-shaped transparent cover 109 referred to hereinabove. The fragmentary top cross-sectional view of FIG. 3 shows a portion of the meter 10 including the radiation sensitive external data interface unit 76 and the shielding baffle 108 extending in alignment with the preselected communications window portion 14 of the meter cover part 109 of the enclosure 12. The cover 109 is preferably made as shown in U.S. Pat. No. 3,846,677 and attached to a base to form a sealed protective enclosure 12 having protective features described in U.S. Pat. Nos. 3,337,802 and 3,413,552, both assigned to the assignee of this invention. The meter 10 includes a conventional induction watthour metering movement, not shown, having a mechanical dial register 110 shown in FIG. 2, for indicating the total kilowatt hour consumption of electrical energy consumption being measured. The watthour metering movement is carried by the base of the enclosure, both not shown, and may be a single-phase type as shown in U.S. Pat. No. 3,309,152 issued Mar. 14, 1967, or polyphase type as shown in U.S. Pat. No. 3,683,276 issued Aug. 8, 1972 equipped with a pulse initiator as described in one of the above-mentioned pulse initiator patents. The meter further encloses the programmable time based electric energy measuring system 15, including the metering sequence logic control circuit 16. The electronic visual display 60 shown in FIGS. 1 and 2, displays the different measured time of day related energy usage parameters and real time data through the front of the meter cover 109. Also in FIG. 3 the radiation sensitive external data interface 76 also has the forward end of the radiation shielding baffle 108 facing the inside of the front of the meter cover behind the preselected window portion 14.

Referring further to FIG. 3, a name plate 111 is mounted in front of first and second circuit boards 112 and 113 carry components of the programmable metering system shown in FIG. 1 except for the electric energy to pulse rate converter 24 which is formed by a pulse initiator operable from the disc of the induction metering movement as noted hereinabove. The radiation emitters 86 and 87 and the radiation sensors 96 and 97 are connected to the pin terminals of the I/O unit 30 of the metering sequence logic control circuit 16 carried on the board 112. The radiation sensors and emitters are mounted so as to be received in the rearward end of the shielding baffle 108 and are aligned with four straight and tunnel-like cylindrical apertures 114, 115, 116 and 117 all shown in FIGS. 1 and 2. The shielding baffle 108 is shown in FIG. 3 in elevation while other parts are shown in section. The top radiation emitter 87 and top radiation sensor 96 are shown aligned with the associated apertures 115 and 114, respectively, of the radiation shielding baffle 108. Accordingly, the electromagnetic radiations 68, 70, 72, and 74 pass through both the apertures 114, 115, 116, and 117 and through the preselected communications window portion 14 of the cover 109 as shown for the radiations 68 and 74 in FIG. 3.

A control mechanism 120, not forming a part of the present invention, is shown in FIG. 3 as it is assembled in sealed relationship to the cover 109 as generally described in U.S. Pat. No. 3,059,181 issued Oct. 16, 1962, and assigned to the assignee of this invention.

To effect data communication via the electromagnetic light radiations 68, 70, 72, and 74, shown in FIG. 1, a field programmer-reader assembly 66 is used as shown in FIGS. 3 and 4. The assembly 66 includes a probe 134 connected by means of a cable 136 to a programmer-reader circuit box 137. The probe 134 includes a light radiation sending and receiving data interface 138 which is complementary to the external data interface 76 of the meter 10. The general circuit arrangement of the interface 138 is shown in FIG. 1 and described further hereinbelow in conjunction with FIG. 4. The forward end 140 of the probe 134 is arranged to mate in a predetermined registering orientation with the preselected window portion 14 of the meter cover 109. The outer portion of the probe 134 includes four straight and tunnel-like cylindrical apertures 142, 143, 144, and 145 intended for coaxial alignment with the apertures 114, 115, 116, and 117, respectively of the shielding baffle 108.

The preselected window portion 14 of the meter cover 109 includes three arcuately spaced conical recesses 150, 152, and 153 shown in FIG. 2. FIG. 3 shows the outline of a cross-sectional view of the index recesses 152 and 153. Three conical projections 156, 158, and 159 shown in FIGS. 3 and 4, project from the forward end 140 of the probe 134. The index projections 156, 158 and 159 are intended to be received by the index recesses 150, 152, and 153 respectively when the probe is manually pressed and held against the outside of the meter cover 109 at the window portion 14. Thus aligned, the tunnel apertures 142, 143, 144, and 145 are coaxially aligned with the apertures 114, 115, 116, and 117.

The radiation sending and receiving interface 138 of the probe 134 has the circuit configuration as shown in FIG. 1 for transmitting the radiations 68 and 70 and receiving the radiations 72 and 74 in a complementary relationship with the meter data interface 76. The interface 138 includes first and second radiation emitters 160 and 162 for producing the radiations 68 and 70, respectively, when they are activated. First and second radiation sensors 164 and 166 are arranged to be activated by the radiation emitters 86 and 87, respectively. The radiation emitters 160 and 162 are formed by optoelectronic light-emitting diodes, LED, of the type corresponding to the radiation emitters 86 and 87 and the radiation sensors 164 and 166 are formed by optoelectronic phototransistors of the type corresponding to the type used in radiation sensors 96 and 97. Accordingly, the radiation emitters 160 and 162 are each connected between a source of voltage +V and through resistors 168 and 169 and transistor amplifiers 170 and 171 and connected in series with the associated radiation emitter by conductors 174 and 175 which are connected to terminals of the programmer-reader circuit 137. The radiation sensors 164 and 166 are connected by conductors 177 and 178 to separate terminals of the circuit 137.

Thus described, it is seen that the mating of the probe 134 with the communications window portion 14 aligns the radiations 68 and 70 from the radiation emitters 160 and 162 of the sending and receiving interface 138 to activate the radiation sensors 96 and 97, respectively, and produce the DATA IN pulses 102 and the STORAGE IN pulses 103 to the I/O unit 30 of the control circuit 16. Correspondingly, the DATA OUT pulses 105 and the STROBE OUT pulses 106 from the I/O unit 30 of the control circuit 16 activate the radiation emitters 86 and 87 to produce the light electromagnetic radiations 72 and 74, respectively, to activate the radiation sensors 164 and 166 of the probe data interface 138.

Figure 5:
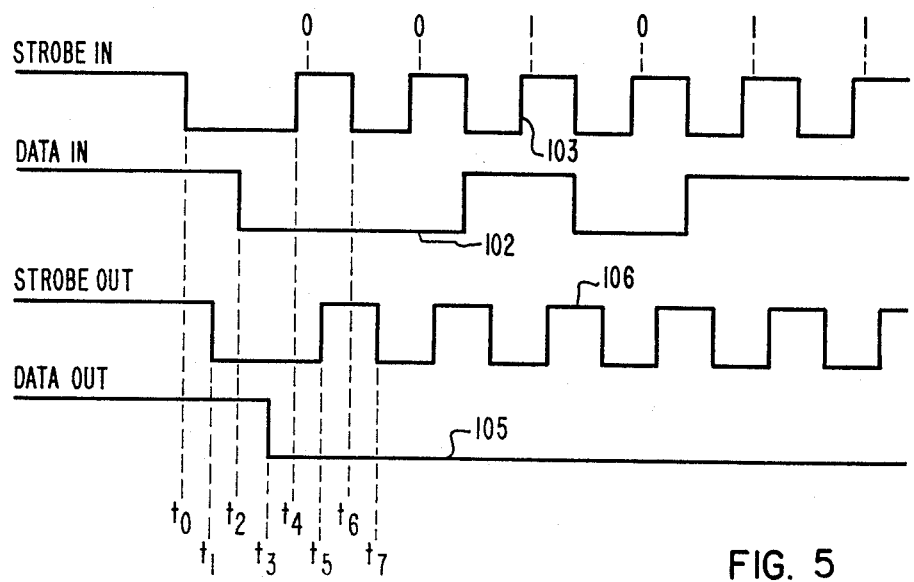
FIG. 5 is a time graph of signals occurring in the block schematic diagram of FIG. 1.

The meter 10 is installed in a typical electric energy measuring receptacle such as a meter box, at an electric utility company's customer location for measuring the electric energy quantity of conductors 20 and 22 in FIG. 1. Accordingly, the meter 10 is stationary and fixed in its operating position and many such meters are utilized by an electric utility company for billing purposes. The field programmer-reader assembly 66 is an easily carried unit and a large number of meters are easily programmed and checked by the easy aligning of the probe 134 against the face of the meter at the preselected solid communications window portion 14 is aligned registration with radiation shielding baffle 108, as shown in FIG. 3. It is understood that the index projections 156, 158 and 159 are inserted into the recess as 150, 152 and 153 when the probe is manually pressed against the face of the cover 109 at the window portion 14. The operation of the control circuit 16 involves a program described further is connection with the description of FIGS. 6A, 6B, 6C and 6D, in the program ROM memory 38 such that the terminals of the I/O unit 30 are connected with conductors 78 and 80 are scanned frequently during the sequence of operation of the control circuit 16. When it is desired to receive data tranmissions from the programmer-reader assembly 66 to program and/or check the data RAM memory 34, the sequence of operation of the signals 102, 103, 105, and 106 are shown in FIG. 5. The control circuit 16 senses unequal logic states on the DATA IN line 78 and the STROBE IN line 80 when the programmer-reader assembly 66 is signalling with radiations 70 that communication between the assembly 66 and the programmable electric energy measuring system 15 is desired.

The data signalling is accomplished by the programmer-reader assembly 66 initiating a synchronous mode of serial data bit transmission. This allows flexibility in the signalling rates between the assembly 66 and the logic control circuit 16. The radiation emitter 162 is activated to produce the light electromagnetic radiations 70 which pass through the window portion 14 to activate the radiation sensor 97 causing the STROBE IN line to go from a binary one to a binary zero state as shown at time $t_0$ in FIG. 5. The DATA IN line 78 remains in the binary one state so that a difference occurs between the lines 78 and 80 which is sensed at the I/O unit 30. When the binary zero state is sensed on the line 78, the control circuit 16 initiates the response signal 106 on the STROBE OUT line 84 activating the radiation emitter 87 producing the light electromagnetic radiations 74 through the meter cover 109 to activate the radiation sensor 166 connected to the circuit 137. The programmer-reader circuit 137 then is signalled that the logic control circuit 16 is ready to receive data. Accordingly, the STROBE OUT pulse 106 shown in FIG. 5 goes from the binary one to a binary zero state as shown at time $t_1$. The first desired bit of binary data information to be transferred is assumed to be a binary zero so that at time $t_2$ the emitter 160 in the programmer-reader sending and receiving interface 138 is activated to produce the light radiations 68, which are received by the radiation sensor 96 in the data interface 76 and produce a binary logic zero on a line 78 as indicated by the pulses 102 in FIG. 5 at the time $t_2$.

The DATA IN on line 78 remains in the logic binary zero and will remain until time $t_6$ for signalling the first zero data bit. At time $t_3$, the DATA OUT line 82 activates the emitter 86 to transmit the electromagnetic radiation 72 throughout the time the data is being received by the external data interface 76. At time $t_4$ the STROBE IN line goes high presenting a rising pulse in response to the deactivation of the radiation emitter 162 which effects sampling of the logic state of signal 102 occurring on the DATA IN line 78. The I/O unit 30 activates the STROBE OUT line 84 and the radiation emitter 87 to produce the radiations 74 signalling that the sampling of the DATA IN pulse 102 has been completed. This would complete one cycle of transfer of one data bit from the programmer-reader assembly 66 to the logic control circuit 16. At time $t_6$ the STROBE IN line 103 goes low the binary zero state again indicating another bit is to be transmitted. The STROBE OUT line 84 activates the emitter 87 to go to the binary zero at time t7 acknowledging that the circuit 16 is ready to receive a pulse. The DATA IN line will have been put at the binary state to be transmitted at the time t6 so that when the STROBE IN line goes high or to the binary one state, the DATA IN line is sampled indicating a binary zero bit indicated at the top line of the graph of signals in FIG. 5 and the STROBE OUT line 87 goes high indicating that the second data bit has been sampled. The same sequence of operation continues to produce a serial bit stream having the following data information: zero, zero, one, zero, one, one. Then the emitters 160 and 162 are both deenergized so that neither of the electromagnetic radiations 68 or 70 are transmitted to the radiation sensors 96 and 97 indicating that no further transmission is to be made from the programmer-reader assembly 66. The interface 76 is then returned to a standby condition with the transmitted data being stored in the data RAM 34.

The data transmissions have a predetermined number of binary data bits. The number of bits received is compared to the total message length or bits contained in the transmission and when they match the receiving unit is rendered to data transmission completed status.

When there is a transmission of data from the logic control circuit 16 in the meter 10 to the programmer-reader assembly 66, the sequence of operation shown in FIG. 5 is reversed with the data information transmission from the meter being provided on the STROBE OUT and DATA OUT lines 82 and 84 corresponding to the operation of the lines 174 and 175 in the interface unit 138 to produce the coded light radiations 68 and 78 which in turn operate as do the aforementioned lines 82 and 84 for receiving data at the meter 10. This meter transmitted mode is used to check the real time data and program constants and to read out the measuring data from the RAM memory 24.

It is apparent by those skilled in the art that an asynchronous data transmission may be provided between the interface units 76 and 138 not requiring the use of the STROBE IN and STROBE OUT lines 84, however, this requires that the data be transferred at a fixed rate rather than different rates utilizing the synchronous transmission described hereinabove. In the synchronous transmission, it is apparent that one unit signals the other unit that it intends to transmit data, the interrogated unit then responds an acknowledgement and then each time data is sent there is an exchange of acknowledgements so that the data is transmitted and received in a manner which is most reliable. The maintaining of the external data interface 76 within the meter enclosure 12 including the meter cover 109 preventsany physical access to the interface 76 so as to prevent tampering or vandalism. Also, as is apparent from the description hereinabove, the interface 76 is completely electricaly isolated from the other communicating unit formed by the programmer-reader 66 when communicating data to the logic control circuit 16.

Figure 3A:
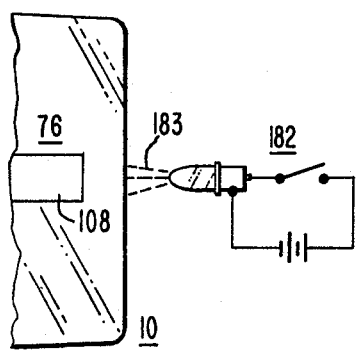
FIG. 3A is a diagrammatic view of the meter shown in FIG. 3 and an external radiation control device.

Another important feature is provided by the arrangement of the interface unit 76 in that a conventional and readily available incandescent bulb source forms an external radiation control device 182 of light radiations 183 shown in FIG. 3A, forms the external radiation control device that can be shined through the face of the cover 109 at the preselected window portion 14 to effect a control operation of the system 15. Incandescent bulbs such as found in flashlights provide sufficient quanta of infrared frequencies of radiations 183 that will activate simultaneously both the radiation sensors 96 and 97. The control unit 16 is activated in response to both of the lines 78 and 80 each going to a low activated condition corresponding to binary zero states and will activate the readout display 60 so that it will display its numerical readout of the various data including the measured parameters totalized by the control circuit 16 and real time registrations when otherwise the readout display 60 may be deactivated by the control circuit 16. A normal operation of the readout display 60 may be that it is only activated for displaying between the hours of six a.m. and six p.m. each day. If it is desired to have the readout display 60 activated, the conventional incandescent light source such as provided by a flashlight that can produce the light electromagnetic radiations 183 which correspond to applying the radiations 68 and 70 simultaneously to produce simultaneously occurring inputs on the lines 78 and 80. This signals the control circuit 16 to turn on the readout display 60 in the hours other than from six p.m. to six a.m. It is contemplated that the readout display 60 may be exclusively activated by the simultaneous inputs rather than cycled on and off by the control circuit 16.

Referring now to the FIGS. 6A, 6B, 6C and 6D there are shown flow diagrams of routines or sequences of operation of the measuring system as established by the fixed program ROM memory 38. As noted above the measuring system is normally operating in either the main routine, shown in FIG. 6A, or, in a timer interrupt routine shown in FIG. 6B. After each sixty pulses from the sixty hertz timing circuit 46 shown in FIG. 1, the main routine is interrupted at one second intervals so the logic control circuit 16 will update the real time storage registers in the RAM memory 34. At initial power supply energization, the power on clear startup operations occur at the beginning of the main routine of the entry step 190. At the following decision step 192, the programmed constants are checked and an error mode is established at step 194 if there is no check. A power fail decision 196 prepared the system for a power outage condition as described more fully in the above-identified copending U.S. Patent application Ser. No. 891,996. The time is updated and then stored in the non-volatile data memory 24 at steps 198 and 200. If no power outage is occurring, the reoccurring principal operations of the main routine are to load the constants data from RAM memory, at step 202, into the logic control circuit 16 and go to a display service subroutine at step 204 to display the real time and measured values. Thereafter, the metering pulse inputs from the pulse rate converter 24 are sampled and the pulse data is stored in step 206. Important to the present invention is the programmer link subroutine at step 208 where the logic control circuit 16 samples to detect whether external data is to be received at the external data interface 76. This subroutine is data interface 76. This subroutine is described further in connection with the description of FIG. 6C. The steps 202 through 208 cyclically reoccur with short interrupts provided by the routine shown in FIG. 6B.

The timer interrupt is entered at the beginning step 210 every one second interval. The time and day is adjusted as required at steps 212 and 214. The decision step 216 determines whether a seven-day or 365-day mode is being used and, if so, the day of the year is adjusted at step 218. Then the rate selection subroutine step 220 checks the current real time against the times at which the different rates or categories of measurements are to change and effect the change if required. This routine is then done at step 222.

Figure 6A:
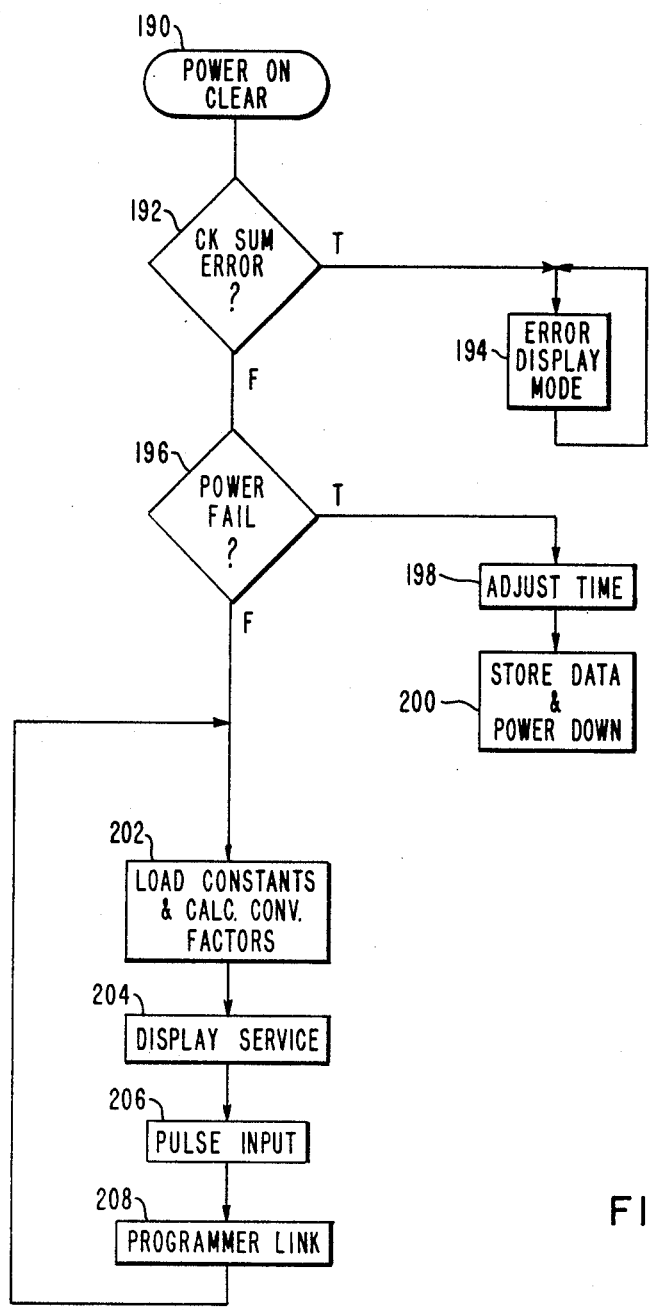
FIGS. 6A, 6B, 6C and 6D illustrate flow chart diagrams showing sequences of operation of the meter shown in FIG. 1.
Figure 6B:
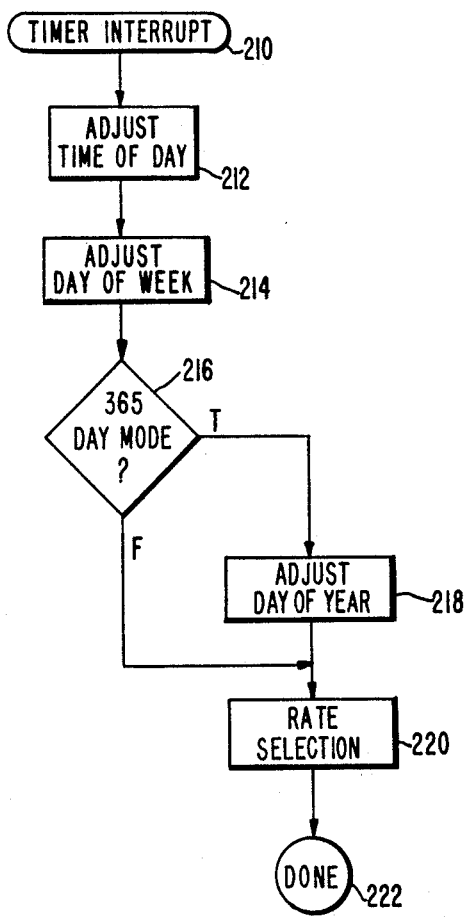

The programmer link subroutine 208 of FIG. 6A is shown in further detail in FIG. 6C for effecting the sequence of operation represented by the graph of signals shown in FIG. 5 and described hereinabove. The subroutine is entered at step 224 and steps 226 and 228 check both the STROBE IN and DATA IN signals 103 and 102, respectively, to see if they are different. If not, the subroutine returns to the main routine of FIG. 6A at step 230 and if true, the subroutine continues to initiate a data receive sequence at step 232. The step 234 checks if the signal 103 is active at a low true and returns to the main routine while checking and testing at decision step 236. When the signal is active, the data logic of signal 102 is saved at step 238 and the STROBE OUT signal 106 is then outputted low true at step 240. The change in state of the signal 103 is awaited at step 242 and decision step 244. When signal 103 goes high, the data signal 102 is sampled at step 246 and acknowledged by step 248 by the change in state of the signal 106 going high. The decision step 250 tests if all the data bits have been received by comparing to a counter which decremented one count with each received data bit. If not equal to zero, the subroutine returns to steps 234 through 250 at step 252 until all the predetermined number of data bits have been received. When input data is completed the subroutine returns to the main routine at step 254. An exact complementary sequence is provided to transmit data from the meter 10 to the programmer-reader assembly 66 through the radiation communication link described above.

Figure 6D:
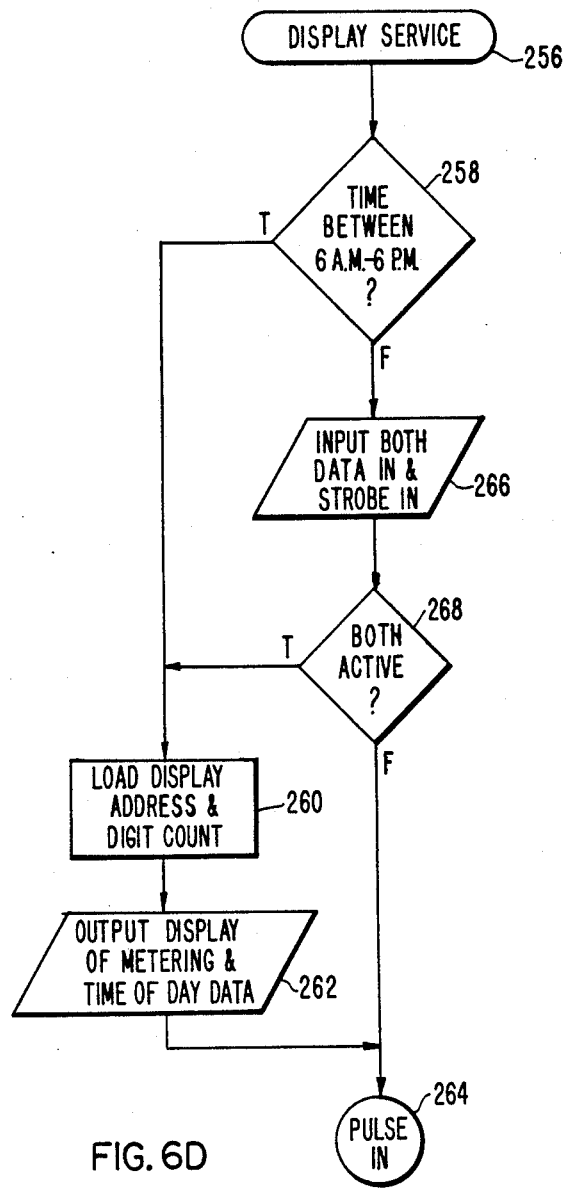
Figure 6C:
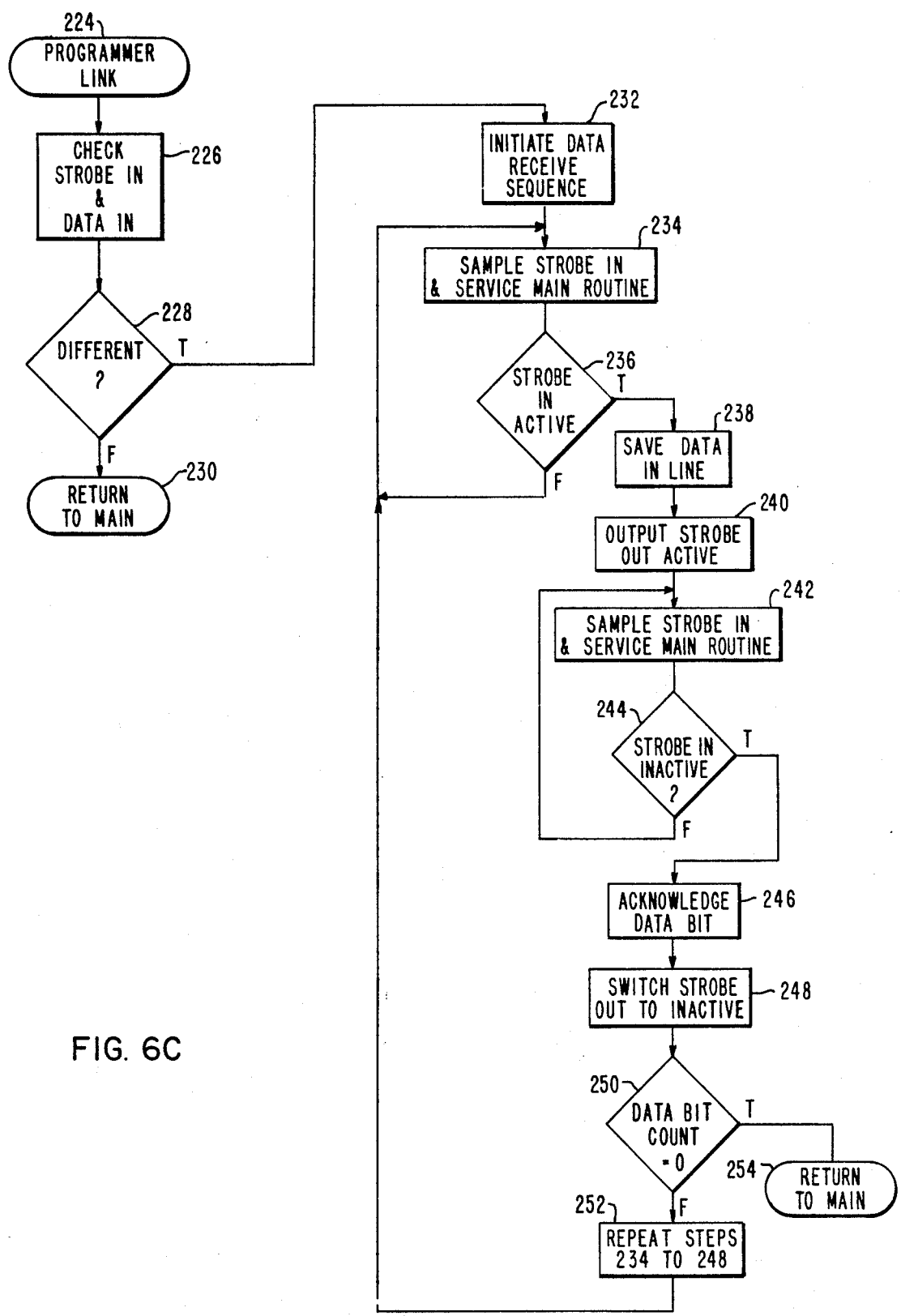

The flow chart of FIG. 6D shows the subroutine for activating the readout display 60 in response to the external radiation control device 182 in FIG. 3. When the main routine reaches the step 204 the display service subroutine is entered at step 256 in FIG. 6D. The decision step 258 checks the existing time of day and checks it against a preselected time. If true, the steps 260 and 262 effect activation of the readout display 60. The subroutine then returns to the main routine of FIG. 6A at the exiting step 264. If the decision step 258 is false, the control circuit 16 tests both of the DATA IN and STROBE IN data lines at step 266. If both lines are active, as provided by the radiations 183 from the source 182, the decision step 268 is true and the display is activated by steps 260 and 262. If the decision step 268 is false, the subroutine exits at step 264. The sequence of operations of the subroutine in FIG. 6D provides activation of the display 60 without any physical access to the circuit 16 through an opening of the meter enclosure 12.

While a preferred embodiment of the invention is described herein, it will be apparent to those skilled in the art that other modifications and alternative arrangements may be made without departing from the spirit and scope of this invention.

I claim:

1. An electric energy meter including a programmable time based measuring system for totalizing measured parameters of electric energy usage, said meter interactively communicating with a programmer/reader unit by way of binary coded light radiations, said meter comprising:

a sealed enclosure including a cup-shaped cover wholly enclosing said measuring system, said cover including an optically transparent portion thereof for allowing the transmission of said light radiations through said enclosure, said cover further including integral index means having a fixed position thereat for orienting said programmer/reader unit;

said measuring system including a metering sequence logic control circuit having a data input/output unit and a read/write data memory means, said memory means electronically storing metering data and program data and being connected to said input/output unit so as to transfer data therebetween;

radiation sensitive data interface means including a first light radiation emitter and a first light radiation sensor for establishing communications with said programmer/reader unit, and including a second light radiation emitter cooperating with both said first light radiation sensor and emitter so as to interactively send data at an arbitrary rate, and further including a second light radiation sensor cooperating with both said first light radiation emitter and sensor so as to interactively receive data at an arbitrary rate; and radiation coupling means providing optically isolated light radiation paths between said transparent portion of said cover and said data interface means, said radiation coupling means having a predetermined aligned position relative to said index means such that said radiation sensitive data interface means is aligned with said programmer/reader unit thereby facilitating interactive bi-directional communication between said programmer/reader unit and said data memory means.

2. An electric energy meter as claimed in claim 1 wherein the cup-shaped cover includes a front face at the closed end thereof having the transparent portion, and wherein the indexing means includes symmetrically spaced recessions extending partially into said front face.

3. An electric energy meter as claimed in claim 1 wherein said first and second light radiation emitters include first and second light light-emitting diodes and wherein the first and second light radiation sensors include first and second photo-transistors.

4. An electric energy meter as claimed in claim 1 wherein the radiation coupling means includes a shielding baffle means having four separate cylindrical apertures extending therethrough so as to provide four optically isolated light radiation paths, one of said light radiation paths for each of said first light radiation sensor and emitter and said second light radiation sensor and emitter.

5. An electric energy meter as claimed in claim 1 including an electronic display means connected to the input/output unit, and wherein the metering sequence logic control circuit is responsive to the simultaneous activation of both the first and the second light radiation sensors so as to switch said display means from an inactive to an active state.

6. An electric energy meter as claimed in claim 1 wherein the first light radiation emitter is effective to produce STROBE OUT binary coded light radiations, the second light radiation emitter is effective to produce DATA OUT binary coded light radiations, the first light radiation sensor is effective to receive STROBE IN binary coded light radiations and the second light radiation sensor is effective to receive DATA IN binary coded light radiations.

7. An electric energy meter as claimed in claim 6 wherein the second light radiation sensor receives DATA IN coded light radiations after the establishment of a communication link between said meter and the programmer/reader unit.

8. An electric energy meter as claimed in claim 7 wherein the communication link is established by the receipt of the STROBE IN coded light radiations identifying the status of the programmer/reader unit and the production of the STROBE OUT coded light radiations identifying the status of said meter, and wherein one bit of data is input to said meter in response to the establishment of said communications link such that said meter controls the rate of input of data thereto so as to remain capable of performing other functions.

9. An electric energy meter as claimed in claim 6 wherein the second light radiation emitter produces the DATA OUT coded light radiations after the establishment of a communication link between said meter and the programmer/reader unit.

10. An electric energy meter as claimed in claim 9 wherein the communication link is established by the production of the STROBE OUT coded light radiations identifying the status of said meter and the receipt of the STROBE IN coded light radiations identifying the status of the programmer/reader unit, and wherein one bit of data is output from said meter in response to the establishment of said communications link such that said meter controls the rate of output of data therefrom so as to remain capable of performing other functions.

11. An electric energy meter including a programmable time based measuring system for totalizing measured parameters of electric energy usage by use of stored program data that is transmitted to the meter through binary coded light radiations, said meter comprising:

a sealed enclosure for mounting at a fixed energy metering location and wholly enclosing said measuring system, said enclosure including an integral and uninterrupted optically transparent portion thereof defining a preselected communications window portion for transmission of a plurality of the coded light radiations through the enclosure;

said measuring system including a metering sequence logic control circuit having a data input/output unit and a read-write data memory means for electronically storing metering data and said stored program data and being connected to said input/output unit to transfer binary information therebetween;

radiation sensitive external data interface means including first and second light radiation emitters and first and second light radiation sensors for selectively communicating with each of four separate ones of the binary coded radiations transmitted through said window portion and being connected to said input/output unit for effecting optoelectronic coupling between said input/output unit and the coded radiations;

electronic readout display means connected to said input/output unit for visually displaying numerical values of the metering data accumulated in said read-write data memory means, said metering sequence logic control circuit further including means cyclically activating and deactivating said readout display means in a programmed sequence, and still further including means responsive to continuous external light radiations transmitted through said window portion and effective to produce the simultaneous activation of said first and second radiation sensors for effecting activation of said readout display means when in an inactivated state so as to provide visual displays at other than the programmed cycles of activation thereof.

* * * * *